(12) United States Patent
Ishino et al.

(10) Patent No.: US 10,836,018 B2
(45) Date of Patent: Nov. 17, 2020

(54) SUBSTRATE HOLDING DEVICE, SUBSTRATE HOLDING MEMBER, AND SUBSTRATE HOLDING METHOD

(71) Applicant: NGK SPARK PLUG CO., LTD., Nagoya (JP)

(72) Inventors: Tomohiro Ishino, Tomiya (JP); Shinya Kikuchi, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 207 days.

(21) Appl. No.: 15/739,581

(22) PCT Filed: Dec. 15, 2016

(86) PCT No.: PCT/JP2016/087331
§ 371 (c)(1),
(2) Date: Dec. 22, 2017

(87) PCT Pub. No.: WO2017/104732
PCT Pub. Date: Jun. 22, 2017

(65) Prior Publication Data
US 2018/0311796 A1 Nov. 1, 2018

(30) Foreign Application Priority Data

Dec. 18, 2015 (JP) .................................. 2015-248032
Dec. 12, 2016 (JP) .................................. 2016-240587

(51) Int. Cl.
*B25B 11/00* (2006.01)
*H01L 21/683* (2006.01)
*H01L 21/687* (2006.01)

(52) U.S. Cl.
CPC ........ *B25B 11/005* (2013.01); *H01L 21/6838* (2013.01); *H01L 21/6875* (2013.01); *H01L 21/68785* (2013.01)

(58) Field of Classification Search
CPC .............. B25B 11/005; H01L 21/6838; H01L 21/6875; H01L 21/68785
(Continued)

(56) References Cited

U.S. PATENT DOCUMENTS

2003/0133762 A1* 7/2003 Yamamoto ........ H01L 21/67132
406/198
2003/0201593 A1* 10/2003 Schmalz ............... B25B 11/005
269/329
(Continued)

FOREIGN PATENT DOCUMENTS

JP 2002-217276 A 8/2002
JP 2003-152060 A 5/2003
(Continued)

OTHER PUBLICATIONS

Japan Patent Office, International Search Report in International Stage of the instant application, dated Mar. 7, 2017.
(Continued)

*Primary Examiner* — Lee D Wilson
*Assistant Examiner* — Thomas Raymond Rodgers
(74) *Attorney, Agent, or Firm* — Stites & Harbison, PLLC; Jeffrey A. Haeberlin; James R. Hayne (57) ABSTRACT

Provided are a substrate holding device and a substrate holding method that enhance the precision of the shape of a substrate while holding the substrate. The substrate holding device includes a first holding member 1, including a plate-shaped first base 10, and a second holding member 2, including a thin plate-shaped second base 20. The first base 10 has an airway 102 extending to the upper surface of the first base 10. The second base 20 has a through hole 202 extending in a thick direction of the second base 20 at a center portion of the second base 20. The second base 20 includes, on the upper surface of the second base 20,
(Continued)

multiple protrusions 211, which protrude upward, and at least one annular ridge 212, which protrudes upward in a substantially annular shape coaxial with the first base 10 and surrounds an upper opening of the through hole 202 and the multiple protrusions 211.

9 Claims, 4 Drawing Sheets (58) Field of Classification Search
  USPC .......................................................... 269/21
  See application file for complete search history.

(56) References Cited

U.S. PATENT DOCUMENTS

| | | | |
|---|---|---|---|
| 2007/0115450 A1 | 5/2007 | Nagasaka et al. | |
| 2007/0128570 A1* | 6/2007 | Goto | .................... F27D 5/0037 |
| | | | 432/253 |
| 2014/0265165 A1* | 9/2014 | Lin | ................... H01L 21/67092 |
| | | | 279/142 |
| 2014/0295355 A1* | 10/2014 | Koya | ........................ G03F 7/20 |
| | | | 430/322 |

FOREIGN PATENT DOCUMENTS

| | | |
|---|---|---|
| JP | 2003-332411 A | 11/2003 |
| JP | 2005-191557 A | 7/2005 |
| JP | 2007-043206 A | 2/2007 |
| JP | 2007-273693 A | 10/2007 |
| JP | 4348734 B2 | 10/2009 |
| JP | 2014-116433 A | 6/2014 |

OTHER PUBLICATIONS

Korean Intellectual Property Office, Office Action (Notification of Reason for Refusal) issued in corresponding Application No. 10-2017-7035905, dated Jul. 9, 2019.

* cited by examiner

SUBSTRATE HOLDING DEVICE, SUBSTRATE HOLDING MEMBER, AND SUBSTRATE HOLDING METHOD

TECHNICAL FIELD

The present invention relates to a substrate holding device that attracts a substrate such as a semiconductor wafer to a base to hold the substrate on the base.

BACKGROUND ART

A substrate holding device having the following structure has been developed (see, for example, PTL 1). The device includes a base, which includes, on its upper surface, an annular first support portion, which supports an outer peripheral portion of a substrate, multiple protruding second support portions, located in an area enclosed by the first support portion, and a tubular portion, which defines an area that does not attract the substrate located in the area enclosed by the first support portion. The device starts sucking air in the inner space of the first support portion defined by the substrate and the base from a suction port adjacent to the tubular portion. This structure prevents creases of the substrate from localizing in the non-attracting portion and thus enhances the flatness of the entirety of the substrate.

CITATION LIST

Patent Literature

PTL 1: Japanese Patent No. 4348734

SUMMARY OF INVENTION

Technical Problem

For manufacturing precision circuit patterns, the line width of light from a light source of a semiconductor exposure device has been progressively reduced to a nanometer scale line width, which is now in the mainstream. Thus, the substrate has been required to have higher flatness.

Also in a coater-developer process accompanying the recent semiconductor exposure process, the substrate has been required to have higher flatness.

The present invention thus aims to provide a substrate holding device and a substrate holding method that can enhance the precision of the shape of a substrate while holding the substrate in a process performed in temperatures other than room temperature besides a process performed in room temperature.

Solution to Problem

A substrate holding device according to the present invention includes a first holding member, including a plate-shaped first base having an airway extending to an upper surface of the first base, and a second holding member, including a plate-shaped second base having a through hole extending in a thickness direction of the second base. The second base is thinner than the first base. The second base includes, on an upper surface of the second base, a plurality of protrusions, which protrude upward, and at least one annular ridge, which protrudes upward and surrounds the through hole and the plurality of protrusions. The second holding member allows a substrate to be mounted thereon and is mounted on the first holding member.

The substrate holding device includes the first holding member, including the first base in which a heating mechanism is built, and the second holding member. The second holding member allows a substrate to be mounted thereon and is mounted on the first holding member.

A substrate holding method according to the present invention is for attracting and holding a substrate using a first holding member and a second holding member, the first holding member and the second holding member constituting a substrate holding device according to the present invention. The method includes a step of mounting the substrate on the second holding member, a step of mounting the second holding member on the first holding member, and a step of reducing pressure of the airway.

In the substrate holding device and with the substrate holding method using the device according to the present invention, a substrate is mounted on the second holding member. A substrate, even when having a relatively significantly warped or bent shape, can be at least partially fitted for the shape of the upper surface of the second base, constituting the second holding member. Specifically, the shape of a substrate even having a relatively significantly warped or bent shape is reformed or corrected into such a shape as to come into contact with the upper end surface of at least one of the multiple protrusions on the upper surface of the second base.

The heating mechanism built in the first holding member is caused to operate in this state, or the heating mechanism is caused to operate in advance, so that the shape of a substrate can be corrected also in the temperatures other than room temperature in the same manner as when the substrate is in room temperature.

In this state, the second holding member is mounted on the first holding member and the pressure in the airway is reduced by a vacuum suction device. Thus, the pressure in the first space defined by the first holding member and the second holding member is reduced through the airway formed in the first base, and the second holding member is attracted to and held on the first holding member. In addition, the pressure in a second space defined by the second holding member and the substrate is reduced through the through hole formed in the second base, and the substrate is attracted to and held on the second holding member. In this state, the substrate comes into contact with the upper end surfaces of all the multiple protrusions formed on the upper surface of the second base.

As described above, a substrate even having a relatively significantly warped or bent shape can be attracted to and held on the second holding member while having its shape highly changed with precision to further fit to the upper end surfaces or contact surfaces of all the multiple protrusions on the upper surface of the second base.

In the substrate holding device according to the present invention, preferably, the second base is warped, and is deformable into a flat shape while the second holding member is attracted to and held on the first holding member.

According to the substrate holding device having the above structure, the shape of a substrate even having a relatively significantly warped or bent shape can be more easily fitted for the shape of the second holding member when the substrate is mounted on the second holding member.

In the substrate holding device according to the present invention, preferably, the first base includes, on the upper surface of the first base, a plurality of protrusions, which protrude upward, and at least one annular ridge, which protrudes upward and surrounds an opening of the airway and the plurality of protrusions. Alternatively, in a substrate holding device according to the present invention, preferably, the second base includes, on the lower surface of the second base, a plurality of protrusions, which protrude downward, and at least one annular ridge, which surrounds the plurality of protrusions.

In the substrate holding device according to the present invention, preferably, the at least one annular ridge includes a plurality of annular ridges, the plurality of annular ridges include an inner annular ridge and an outer annular ridge surrounding the inner annular ridge on the upper surface of the second base, and the plurality of annular ridges other than the outermost annular ridge protrude upward a smaller distance than the plurality of protrusions.

In the substrate holding device according to the present invention, preferably, the at least one annular ridge includes a plurality of annular ridges, the plurality of annular ridges include an inner annular ridge and an outer annular ridge surrounding the inner annular ridge on the upper surface of the second base, and each of the plurality of annular ridges protrudes upward the same distance as the plurality of protrusions. Preferably, the through hole includes multiple through hole portions formed in the second base so as to correspond to a plurality of spaces defined by the plurality of annular ridges between the second holding member and the substrate.

Figure 1:
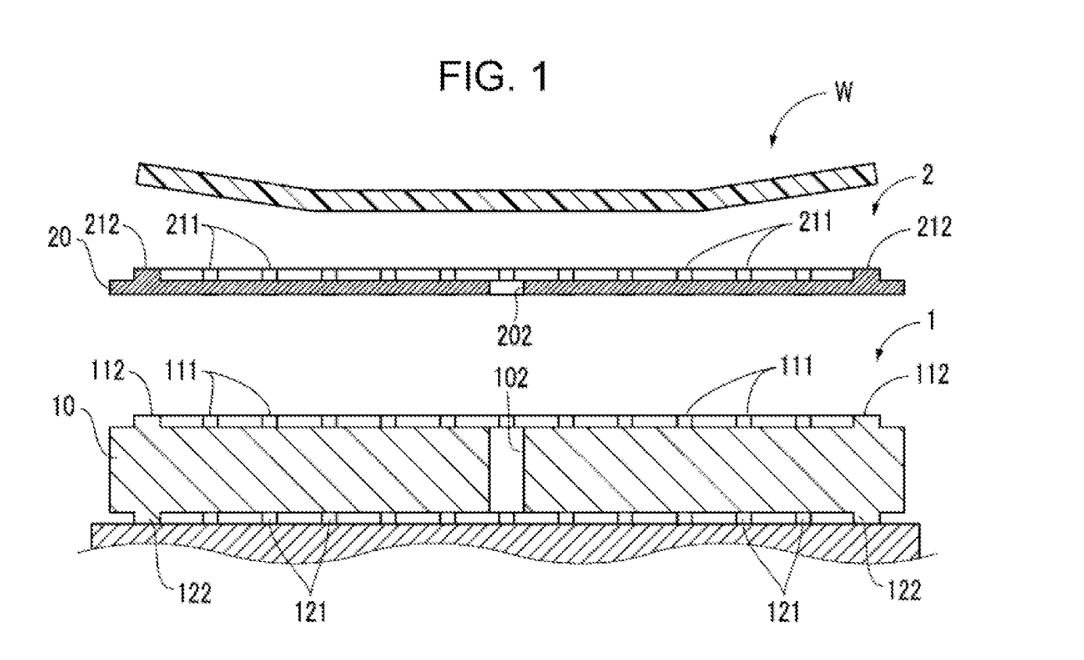
FIG. 1 is a diagram of the structure of a substrate holding device according to a first embodiment of the present invention.

DESCRIPTION OF EMBODIMENTS (First Embodiment) (Structure) A substrate holding device according to a first embodiment of the present invention illustrated in FIG. 1 includes a first holding member 1, which includes a substantially disk-shaped first base 10 formed of a sintered ceramic body, and a second holding member 2, which includes a substantially disk-shaped second base 20 formed of a sintered ceramic body. The second base 20 is designed to have a diameter the same as or within ±5% of that of the first holding member 1 and to have a thickness smaller than that of the first holding member 1 (for example, approximately 0.5 to 1.5 mm). An example usable as the sintered ceramic body is a sintered SiC body or a sintered $Al_2O_3$ body.

The first base 10 has airways 102 extending to the upper surface of the first base 10. In this embodiment, the airways 102 extend through the first base 10 in the thickness direction of the first base 10 at, for example, the positions corresponding to the vertexes of a regular polygon (for example, a regular triangle) having its centroid at the center of the first base 10. The number or the arrangement of the upper openings of the airways 102 may be changed in various different ways, for example, a single opening may be formed at the center of the first base 10, or multiple openings may be formed at any positions apart from the center of the first base 10. The airways 102 may extend sideways inside the first base 10 from side openings of the first base 10 and then extend upward to the upper surface of the first base 10. Grooves may be formed in the lower surface of the first base 10 and the first base 10 may be fixed to a support base (not illustrated) with the lower surface of the first base 10 in contact with the upper surface of the support base so that the path defined by the support base and the grooves may serve as part of the airways 102.

The first base 10 includes, on the upper surface of the first base 10, multiple protrusions 111, which protrude upward, and a single annular ridge 112, which protrudes upward in a substantially annular shape coaxial with the first base 10 to surround the upper openings of the airways 102 and the multiple protrusions 111. Each protrusion 111 has a shape having a flat upper end surface, such as a round pillar, prism, truncated cone, or truncated pyramid, or, a stepped round pillar, stepped prism, stepped truncated cone, or stepped truncated pyramid, having its upper portion smaller than its lower portion. The multiple protrusions 111 are regularly (or periodically) arranged in, for example, a grid pattern (tetragonal grid pattern or hexangular grid pattern). The height of the annular ridge 112 or the distance by which the annular ridge 112 protrudes from the upper surface of the first base 10 may be the same as or smaller than that of the protrusions 111.

The first base 10 includes, on the lower surface of the first base 10, multiple protrusions 121, which protrude downward, and a single annular ridge 122, which protrudes downward in a substantially annular shape coaxial with the first base to surround the lower openings of the airways 102 and the multiple protrusions. Each protrusion 121 has a shape having a flat lower end surface, such as a round pillar. The multiple protrusions 121 are regularly arranged in, for example, a grid pattern. The height of the annular ridge 122 or the distance by which the annular ridge 122 protrudes from the lower surface of the first base 10 may be the same as or smaller than that of the protrusions 121. The position of each protrusion 111 on the upper surface of the first base 10 and the position of the corresponding protrusion 121 on the lower surface of the first base 10 may be symmetrical or asymmetrical with respect to the plane in the middle of the upper surface and the lower surface of the first base 10. At least one of the multiple protrusions 121 on the lower surface of the first base 10, or all the multiple protrusions 121 and the annular ridge 122 on the lower surface of the first base 10 may be omitted.

The second base 20 has a through hole 202 extending in the thickness direction at the center of the second base 20. The second base 20 includes, on its upper surface, multiple protrusions 211, which protrude upward, and a single annular ridge 212, which protrudes upward in a substantially annular shape coaxial with the second base 20 to surround the upper opening of the through hole 202 and the multiple protrusions 211. Each protrusion 211 has a shape having a flat upper end surface. The multiple protrusions 211 are regularly arranged in, for example, a grid pattern. The height of the annular ridge 212 or the distance by which the annular ridge 212 protrudes from the upper surface of the second base 20 may be the same as or smaller than that of the protrusions 211.

(Function) In a substrate holding device according to the first embodiment of the present invention, a substrate W is mounted on the second holding member 2. A substrate W, even when having a relatively significantly warped or bent shape, can be at least partially fitted for the shape of the upper surface of the second base 20, constituting the second holding member 2. Specifically, a substrate W even having a relatively significantly warped or bent shape can be reformed or corrected into such a shape as to come into contact with the upper end surface of at least one of the multiple protrusions 211 on the upper surface of the second base 20.

Figure 3:
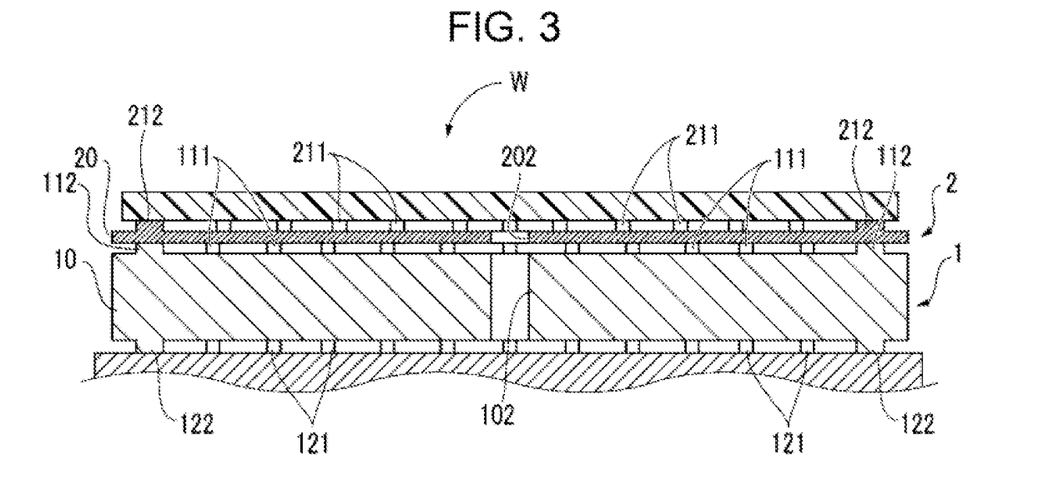
FIG. 3 is a diagram of a substrate holding device according to the present invention in the state of attracting and holding a substrate.

In this state, the second holding member 2 is mounted on the first holding member 1 and the airways 102 are subjected to pressure reduction by a vacuum suction device (not illustrated). Thus, the pressure in a first space defined by the first holding member 1 and the second holding member 2 is reduced through the airways 102 formed in the first base 10, and the second holding member 2 is attracted to and held on the first holding member 1 (see FIG. 3). In addition, the pressure in a second space defined by the second holding member 2 and the substrate W is reduced through the through hole 202 formed in the second base 20, and the substrate W is attracted to and held on the second holding member 2 (see FIG. 3). At this stage, the substrate W is in contact with the upper end surfaces of all the multiple protrusions 211 formed on the upper surface of the second base 20. As described above, a substrate W even having a relatively significantly warped or bent shape can be attracted to and held on the second holding member 2 while having its shape changed with precision to further fit to the upper end surfaces or contact surfaces of all the multiple protrusions 211 on the upper surface of the second base 20.

Figure 2:
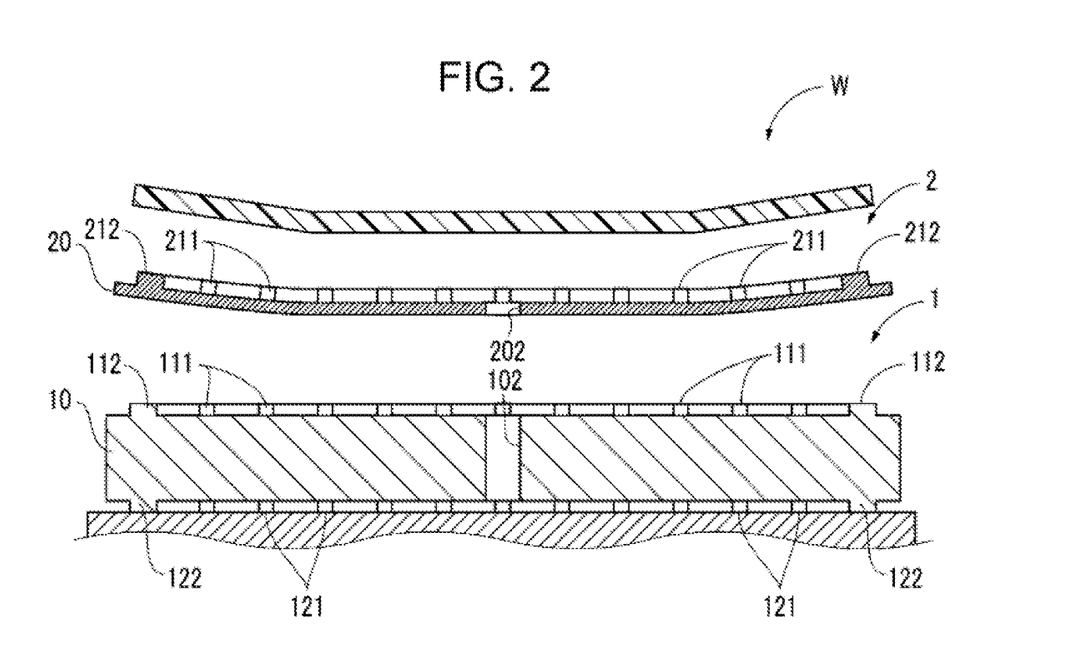
FIG. 2 is a diagram of the structure of a substrate holding device according to a second embodiment of the present invention.

(Second Embodiment) (Structure) A substrate holding device according to a second embodiment of the present invention illustrated in FIG. 2 includes a second base 20 warped in conformance with, for example, part of a spherical surface, ellipsoidal surface, or round pillar surface to such an extent as to reduce the warpage or distortion of the wafer W to some extent (for example, approximately half). The other components are the same as those of the substrate holding device according to the first embodiment (see FIG. 1) and denoted with the same reference symbols without any description.

The second base 20 has such a warped shape that the locations of the center and the outer periphery are deviated by 0.1 to 1.0 mm in a direction normal to the upper surface at the center. The second base 20 is deformable into a flat shape (shape substantially conforming to the normal shape of the second base 20 according to the first embodiment) while the second holding member 2 is attracted to and held on the first holding member 1 (see FIG. 3).

The upper end surfaces of the protrusions 211 located close to the outer peripheral portion may be inclined to face inward so that the upper end surfaces of multiple protrusions 211 are located on the same plane when the second base 20 is deformed into a flat shape. For ease of deformation of the second base 20, the second base 20 may be partially thinned. Multiple protrusions 211 may be formed such that the protrusions 211 in the thinned portion protrude further than the protrusions 211 in the other portion so that the multiple protrusions 211 have the same level when the second base 20 is deformed into a flat shape.

(Function) In the substrate holding device according to the second embodiment of the present invention, a substrate W even having a relatively significantly warped or bent shape can be more easily fitted for the shape of the second holding member 2 when the substrate W is mounted on the second holding member 2.

Figure 4:
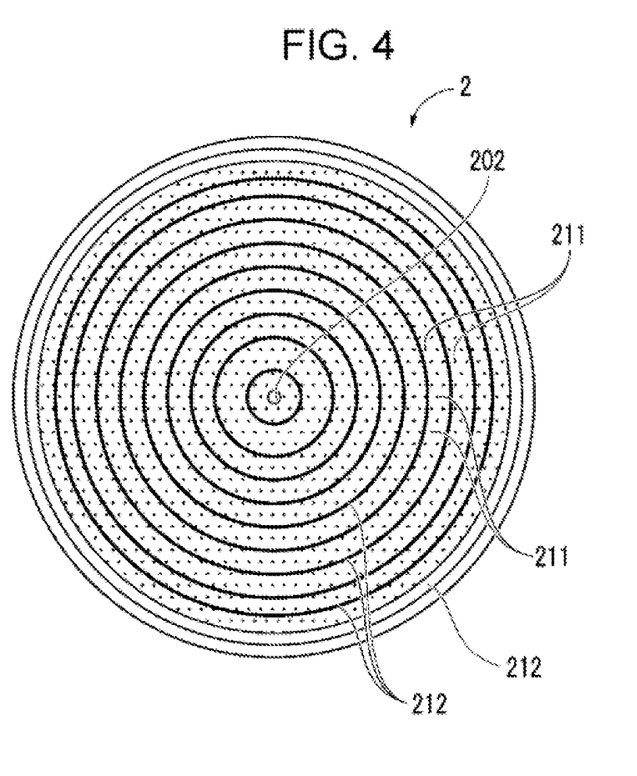
FIG. 4 is a top plan view of a substrate holding device according to another embodiment of the present invention.
Figure 6:
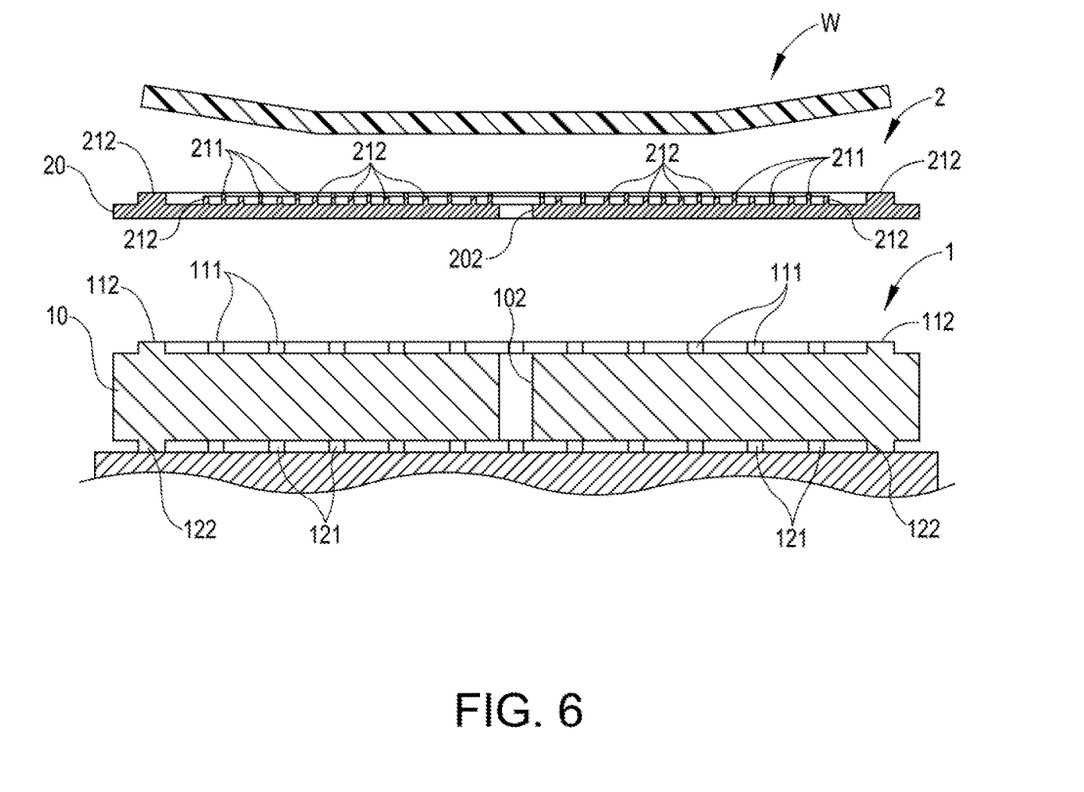
FIG. 6 is a diagram of the structure of a substrate holding device according to a fourth embodiment of the present invention.

(Other Embodiments of Present Invention) In the first to second embodiments, a single annular ridge 212 is formed on the upper surface of the second base 20 (see FIG. 1 to FIG. 2). In some other embodiments, as illustrated in FIG. 4, multiple (11 in the example of FIG. 4) annular ridges 212 may be formed such that outer annular ridges surround an inner annular ridge 212 on the upper surface of the second base 20, and at least one of the multiple annular ridges 212 may be formed to protrude upward a smaller distance than the multiple protrusions 211. For example, as shown in FIG. 6, the outermost one of the multiple annular ridges 212 protrudes upward the same distance as the multiple protrusions 211, whereas the annular ridges 212 on the inner side of the outermost annular ridge 212 protrude upward a smaller distance than the multiple protrusions 211. Alternatively, at least first and second outermost annular ridges 212 may be formed to protrude upward a smaller distance than the multiple protrusions 211, and the first outermost annular ridge 212 may protrude upward a smaller distance than the second outermost annular ridge 212 at least partially in the circumferential direction.

Figure 5:
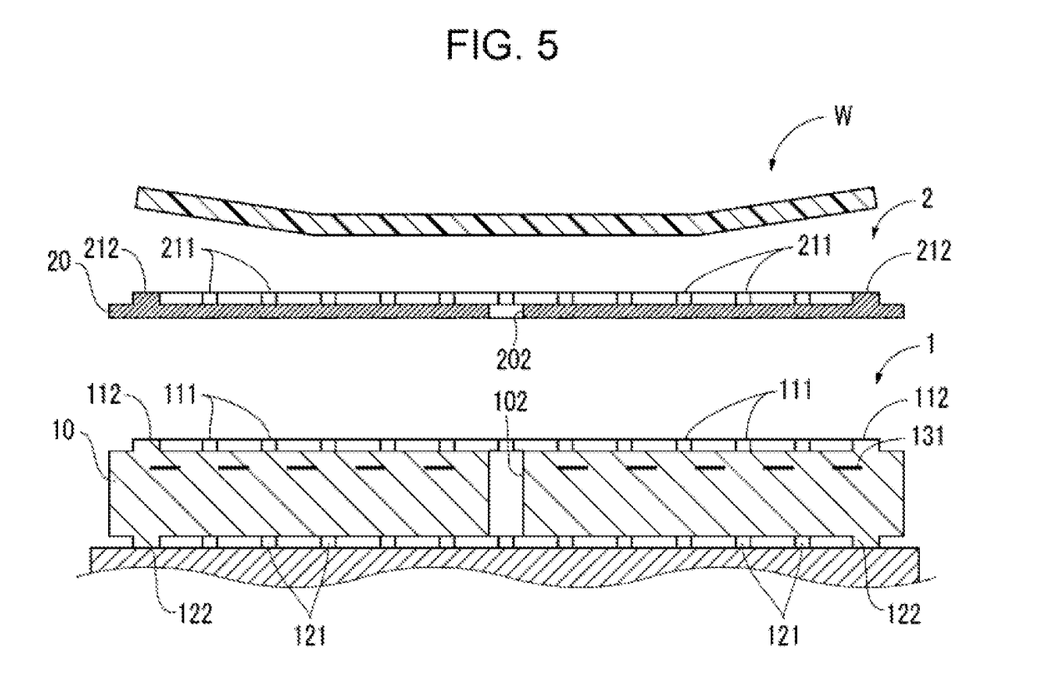
FIG. 5 is a diagram of the structure of a substrate holding device according to a third embodiment of the present invention.

(Third Embodiment) (Structure) A substrate holding device in a third embodiment of the present invention illustrated in FIG. 5 includes a first holding member 1, which includes a substantially disk-shaped first base 10 formed of a sintered AlN body, and a second holding member 2, which includes a substantially disk-shaped second base 20 formed of a sintered ceramic body. A heating resistor 131 formed of a molybdenum mesh is built in the sintered AlN body by co-firing. The second base 20 is designed to have a diameter the same as or within ±5% of that of the first holding member 1 and to have a thickness smaller than that of the first holding member 1 (for example, approximately 0.5 to 1.5 mm).

When used in temperatures other than room temperature, a sintered $Al_2O_3$ body, a sintered AlN body, and a sintered SiC body are preferably used as the sintered ceramic body constituting the first base 10 of the first holding member 1. This is because these bodies can be processed with high precision and they have high thermal conductivity to be capable of uniformly heating the substrate W with the second holding member 2 interposed therebetween. The heating resistor 131 can be built in the first holding member 1 by, for example, co-firing by hot-pressing, co-firing after laminating a green sheet on a green sheet on which a heating resistor is printed, or joining the heating resistor 131 after manufacturing a sintered ceramic body.

The first base 10 has airways 102 extending to the upper surface of the first base 10. In this embodiment, the airways 102 extend through the first base 10 in the thickness direction of the first base at, for example, the positions corresponding to the vertexes of a regular polygon (for example, a regular triangle) having its centroid at the center of the first base 10. The number or the arrangement of the upper openings of the airways 102 may be changed in various different ways, for example, a single opening may be formed at the center of the first base 10, or multiple openings may be formed at any positions apart from the center of the first base 10. The airways 102 may extend sideways inside the first base 10 from side openings of the first base 10 and then extend upward to the upper surface of the first base 10. Grooves may be formed in the lower surface of the first base 10, and the first base 10 may be fixed to a support base (not illustrated) with the lower surface of the first base 10 in contact with the upper surface of the support base so that the path defined by the support base and the grooves may serve as part of the airways 102.

The first base 10 includes, on the upper surface of the first base 10, multiple protrusions 111, which protrude upward, and a single annular ridge 112, which protrudes upward in a substantially annular shape coaxial with the first base 10 to surround the upper openings of the airways 102 and the multiple protrusions 111. Each protrusion 111 has a shape having a flat upper end surface, such as a round pillar, prism, truncated cone, or truncated pyramid, or, a stepped round pillar, stepped prism, stepped truncated cone, or stepped truncated pyramid, having its upper portion smaller than its lower portion. The multiple protrusions 111 are regularly (or periodically) arranged in, for example, a grid pattern (tetragonal grid pattern or hexangular grid pattern). The height of the annular ridge 112 or the distance by which the annular ridge 112 protrudes from the upper surface of the first base 10 may be the same as or smaller than that of the protrusions 111.

The first base 10 includes, on the lower surface of the first base 10, multiple protrusions 121, which protrude downward, and a single annular ridge 122, which protrudes downward in a substantially annular shape coaxial with the first base to surround the lower openings of the airways 102 and the multiple protrusions. Each protrusion 121 has a shape having a flat lower end surface, such as a round pillar. The multiple protrusions 121 are regularly arranged in, for example, a grid pattern. The height of the annular ridge 122 or the distance by which the annular ridge 122 protrudes from the lower surface of the first base 10 may be the same as or smaller than that of the protrusions 121. The position of each protrusion 111 on the upper surface of the first base 10 and the position of the corresponding protrusion 121 on the lower surface of the first base 10 may be symmetrical or asymmetrical with respect to the plane in the middle of the upper surface and the lower surface of the first base 10. At least one of the multiple protrusions 121 on the lower surface of the first base 10, or all the multiple protrusions 121 and the annular ridge 122 on the lower surface of the first base 10 may be omitted.

The second base 20 has a through hole 202 extending in the thickness direction at the center of the second base 20. The second base 20 includes, on its upper surface, multiple protrusions 211, which protrude upward, and a single annular ridge 212, which protrudes upward in a substantially annular shape coaxial with the second base 20 to surround the upper opening of the through hole 202 and the multiple protrusions 211. Each protrusion 211 has a shape having a flat upper end surface. The multiple protrusions 211 are regularly arranged in, for example, a grid pattern. The height of the annular ridge 212 or the distance by which the annular ridge 212 protrudes from the upper surface of the second base 20 may be the same as or smaller than that of the protrusions 211.

(Function) In the substrate holding device according to the third embodiment of the present invention, a substrate W is mounted on the second holding member 2 in a temperature other than room temperature. A substrate W, even when having a relatively significantly warped or bent shape, can be at least partially fitted for the shape of the upper surface of the second base 20, constituting the second holding member 2. Specifically, a substrate W even having a relatively significantly warped or bent shape can be reformed or corrected into such a shape as to come into contact with the upper end surface of at least one of the multiple protrusions 211 on the upper surface of the second base 20.

In this state, the second holding member 2 is mounted on the first holding member 1 and the airways 102 are subjected to pressure reduction by a vacuum suction device (not illustrated). Thus, the pressure in a first space defined by the first holding member 1 and the second holding member 2 is reduced through the airways 102 formed in the first base 10, and the second holding member 2 is attracted to and held on the first holding member 1 (see FIG. 3). In addition, the pressure in the second space defined by the second holding member 2 and the substrate W is reduced through the through hole 202 formed in the second base 20, and the substrate W is attracted to and held on the second holding member 2 (see FIG. 3). At this stage, the substrate W is in contact with the upper end surfaces of all the multiple protrusions 211 formed on the upper surface of the second base 20. As described above, a substrate W even having a relatively significantly warped or bent shape can be attracted to and held on the second holding member 2 while having its shape changed with precision to further fit to the upper end surfaces or contact surfaces of all the multiple protrusions 211 on the upper surface of the second base 20.

In other embodiments, the multiple annular ridges 212 may be formed to protrude upward the same distance as the multiple protrusions 211, and through holes 202 extending in the axial line direction of the second base 20 may be formed in the second base 20 so as to correspond to multiple spaces defined by the multiple annular ridges 212 between the second holding member 2 and the substrate W. The multiple spaces include a substantially circular space defined by the innermost annular ridge 212 and one or more substantially annular spaces surrounding the substantially circular space.

REFERENCE SIGNS LIST 1 first holding member
2 second holding member
10 first base
20 second base
102 airway
111 protrusion
112 annular ridge
121 protrusion
122 annular ridge
131 heating resistor
202 through hole
211 protrusion
212 annular ridge
W substrate

The invention claimed is:
1. A substrate holding device, comprising:
a first holding member including a plate-shaped first base having an airway extending to an upper surface of the first base; and
a second holding member including a plate-shaped second base having a through hole extending in a thickness direction of the second base, the second base being thinner than the first base, the second base including, on an upper surface of the second base, a plurality of protrusions, which protrude upward, and at least one annular ridge, which protrudes upward and surrounds the through hole and the plurality of protrusions,
wherein the second holding member allows a substrate to be mounted thereon and is mounted on the first holding member, wherein the second base is warped in that a circumference of the second base is disposed at a position higher than a center of the second base, wherein the second base is more warped than the first base, and is deformable into a shape as flat as the first base while the second holding member is attracted to and held on the first holding member.

2. The substrate holding device according to claim 1, wherein the first base includes a plurality of protrusions, which protrude upward, and at least one annular ridge, which protrudes upward and surrounds an opening of the airway and the plurality of protrusions, on the upper surface of the first base.

3. The substrate holding device according to claim 1, wherein the at least one annular ridge includes a plurality of annular ridges, the plurality of annular ridges include an innermost annular ridge and an outer annular ridge or outer annular ridges surrounding the innermost annular ridge on the upper surface of the second base, and at least one of the plurality of annular ridges protrudes upward a smaller distance than the plurality of protrusions.

4. The substrate holding device according to claim 1, wherein the at least one annular ridge includes a plurality of annular ridges, the plurality of annular ridges include an innermost annular ridge and an outer annular ridge or outer annular ridges surrounding the innermost annular ridge on the upper surface of the second base, and each of the plurality of annular ridges protrudes upward the same distance as the plurality of protrusions, and wherein the through hole includes multiple through hole portions formed in the second base so as to correspond to a plurality of spaces defined by the plurality of annular ridges between the second holding member and the substrate.

5. The substrate holding device according to claim 1, comprising:
a heating mechanism built in the first base.

6. A substrate holding member serving as a second holding member mounted on a first holding member, including a plate-shaped first base having an airway extending to an upper surface of the first base, the substrate holding member comprising:
a base having a through hole extending in a thickness direction of the base, the base including, on an upper surface of the base on which a substrate is mounted, a plurality of protrusions, which protrude upward, and at least one annular ridge, which protrudes upward and surrounds the through hole and the plurality of protrusions;

wherein the base of the second holding member is warped in that a circumference of the base of the second holding member is disposed at a position higher than a center of the base of the second holding member, wherein the base of the second holding member is more warped than the first base, and is deformable into a shape as flat as the first base while the second holding member is attracted to and held on the first holding member.

7. The substrate holding member according to claim 6, wherein the at least one annular ridge includes a plurality of annular ridges, the plurality of annular ridges include an innermost annular ridge and an outer annular ridge or outer annular ridges surrounding the innermost annular ridge on the upper surface of the base, and at least one of the plurality of annular ridges protrudes upward a smaller distance than the plurality of protrusions.

8. The substrate holding member according to claim 6, wherein the at least one annular ridge includes a plurality of annular ridges, the plurality of annular ridges include an innermost annular ridge and an outer annular ridge or outer annular ridges surrounding the innermost annular ridge on the upper surface of the base, and each of the plurality of annular ridges protrudes upward the same distance as the plurality of protrusions, and wherein the through hole includes multiple through hole portions formed in the base so as to correspond to a plurality of spaces defined by the plurality of annular ridges between the second holding member and the substrate.

9. A substrate holding method for attracting and holding a substrate using a first holding member and a second holding member, the first holding member including a plate-shaped first base having an airway extending to an upper surface of the first base, the second holding member including a plate-shaped second base having a through hole extending in a thickness direction of the second base, the second base being thinner than the first base, the second base including, on an upper surface of the second base, a plurality of protrusions, which protrude upward, and at least one annular ridge, which protrudes upward and surrounds the through hole and the plurality of protrusions, the method comprising:
a step of mounting the substrate on the second holding member;
a step of mounting the second holding member on the first holding member; and
a step of reducing pressure of the airway;
wherein the second base is warped in that a circumference of the second base is disposed at a position higher than a center of the second base,
wherein the second base is more warped than the first base, and is deformable into a shape as flat as the first base while the second holding member is attracted to and held on the first holding member.

* * * * *